United States Patent [19]

Donzelli

[11] Patent Number: 4,700,467

[45] Date of Patent: Oct. 20, 1987

[54] PROCESS FOR GROUNDING FLAT DEVICES AND INTEGRATED CIRCUITS

[75] Inventor: Giampiero Donzelli, Milan, Italy

[73] Assignee: Telettra-Telefonia Eletrronica e Radio, S.p.A., Italy

[21] Appl. No.: 742,520

[22] Filed: Jun. 7, 1985

[30] Foreign Application Priority Data

Jun. 22, 1984 [IT] Italy .................... 21553 A/84

[51] Int. Cl.⁴ ............................ H01L 21/78
[52] U.S. Cl. ...................... 437/209; 148/DIG. 56; 148/DIG. 126; 148/DIG. 135; 156/631; 156/649; 156/662; 357/23.2; 357/41; 427/98
[58] Field of Search ............ 29/571, 580, 583, 589, 29/591; 148/DIG. 56, DIG. 126, DIG. 135; 156/631, 649, 662; 357/23.2, 41; 427/88, 92, 98

[56] References Cited

U.S. PATENT DOCUMENTS 3,771,219 11/1973 Tuzi et al. .................... 29/589
4,317,125 2/1982 Hughes et al. ................ 29/580

FOREIGN PATENT DOCUMENTS 55-545 4/1980 Japan ........................ 29/580

OTHER PUBLICATIONS

Ghandi, VLSI Fabrication Principles Silicon and Gallium Arsenide, John Wiley and Sons, New York, 1983, pp. 443–446, 453–455, 482–487 and 556–560.

Primary Examiner—Brian E. Hearn
Assistant Examiner—Beverly A. Pawlikowski
Attorney, Agent, or Firm—Ostrolenk, Faber, Gerb & Soffen

[57] ABSTRACT

Grounding of source contacts (S) of flat devices and integrated circuits (of the FET type) is carried out according to the following process steps: a GaAs wafer is applied on a support and is covered on its free or rear face with photoresist; the latter is then etched along the border lines of the single FETs; the GaAs layer between contiguous FETs is removed also to make accessible the contacts S; a layer of noble metal is then deposited on the FET rear faces, so that it bridges the contacts S; the single metallized devices are disconnected from the initial support and finally are soldered to a package base.

2 Claims, 6 Drawing Figures

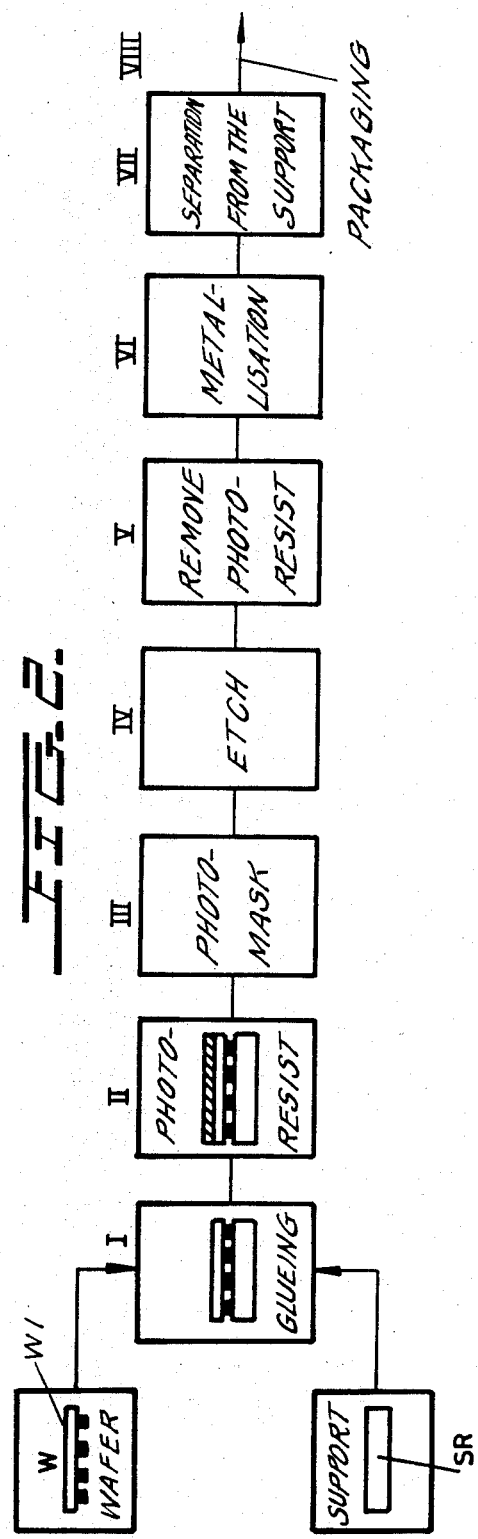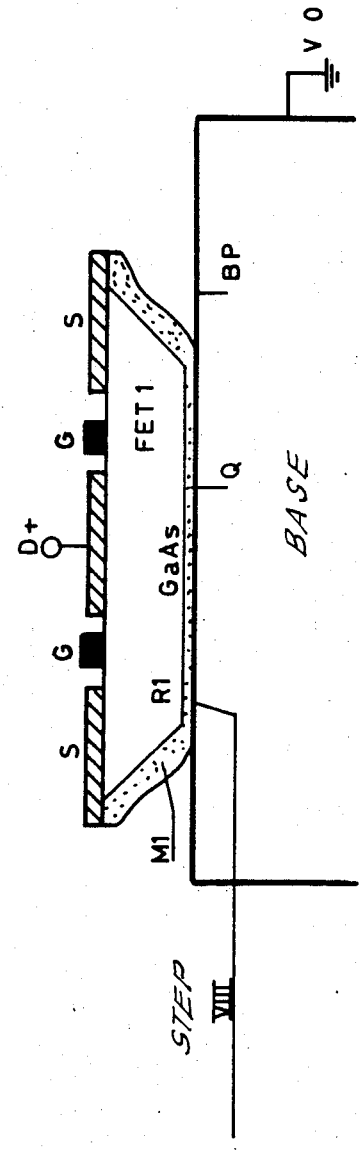

PROCESS FOR GROUNDING FLAT DEVICES AND INTEGRATED CIRCUITS

BACKGROUND OF THE INVENTION

This invention concerns a process to ground flat devices and integrated circuits, especially microwave devices like GaAs power FETs that consist of a bottom on the basis of Ga arsenide, on which three contacts, S (source), D (drain) and G (gate) are provided.

The invention also comprises the products obtained with the aid of said process.

PRIOR ART

The flat devices and integrated circuits are widely known and used in electronics, especially in telecommunications. One of the classical examples of said devices is the so called FET (Field Emitting Transistor) and in particular the GaAs power FET.

For the sake of clarity, reference is made to FIG. 1 where a top view of a traditional FET is shown.

On its bottom or base of Ga arsenide it has three contacts generally indicated as: S=source, D=drain, G=gate.

Said FET contacts are connected to: D to a positive potential, G to a negative potential and S to zero (ground), respectively. Generally, said connections are carried out through noble metal wires soldered to the pads of the contacts.

In particular, the connection of S to zero (ground) takes place by soldering, by means of gold wires with an extremely small diameter (e.g. 25 microns),the source pads to the support (SUP) carrying the FET.

Usually said soldering is accomplished by means of the thermal compression technique and the support (SUP) coincides with the ground terminal of the device. The thermal compression technique is well known, so even if it is not necessary to give a detailed description, it is pointed out that use is made of a capillary machine for pressing and heating the very thin gold wires on the source pads.

Even though this technique presents a certain interest, it is not without inconveniences among which only a few of the most serious ones are mentioned:
  poor reproduction capacity of the connection, which
    is due, among others, to the fact that it is impossible
    to keep absolutely constant the length of the wires
    and the position of soldering to the source pads.
  Introduction of parasitic effects e.g. in the microwave
    operation of the device, the higher the dimension
    of the chip and the operating frequency the heavier
    said parasitic effects. Same are transformed into a
    poor reproducibility of the microwave perfor-
    mances of identical devices.
  Specialized personnel and equipment are required.

In order to overcome said inconveniences and restrictions, a great deal of efforts have been undertaken, among which are the following two techniques:
  (a) "sheet grounding" techinque;
  (b) "via hole" technique.

Technique a) consists in rack ragging the board of the chip (single FET) on a gold/tin alloy thus soldering the metallized rear of the chip ("ground") to the contact of S that touches the board.

The more sophisticated technique (b), consists of making by means of the thin film technique, metallized holes so that through the chips the electrical connection takes place between the metallization of the rear and the contact of the source.

Among the major restrictions of technique (a) are the following:
  a very critical manual proceeding;
  long lasting training of personnel;
  unsuitable technique for high power devices (because
    of the chip dimensions).

Among the restrictions of technique (b) the following ones are mentioned;
  low yield proceeding;
  sophisticated alignment equipment are needed;
  a very accurate calibration is necessary when making
    the holes;
  the wafer must be made very thin (diameter less than
    50 $\mu$m), as a consequence handling becomes critical
    due to the extreme fragility of the GaAs.

SUMMARY OF THE INVENTION

The main object of this invention is to provide a technological process to ground the source contacts, without the inconveniences of the above techniques and which, among others, is easy to apply, involving little sophisticated means and little specialized personnel, and has a good yield.

Another object is the provision of flat devices and integrated circuits (chips) which have a high reproduction capacity of the grounding connection and are practically without parasitic effects, especially in the microwave field wherein they have highly repetitive performances.

A third object is represented by the packages obtained from soldering the single metallized chips to an adequate base. Said and further objects are reached by applying the process according to the invention which is characterized in that:

(I) a GaAs wafer (W) carrying several flat devices (chips) is fixed on a rigid support (SR);

(II) a layer of photoresist (FR) is laid on the free or rear surface of said wafer (W) (not touching the support);

(III) a photomask is made on the photoresist (FR) in order to obtain openings along the separating lines or borders of single devices present on the face of the wafer (W) touching the support;

(IV) the GaAs material under said openings made in the photoresist is removed until the single chips are completely separated and the source (S) contacts become accessible;

(V) the remaining photoresist still present on the rear of the devices is reomved;

(VI) the rear face of the single devices is metallized and said metallization layer is extended to the contacts of S that have become accessible by the GaAs removal of step (IV);

(VII) the single devices thus metallized on the rear surface are extracted from the support;

(VIII) the metallized rear face of the disconnected single chips is soldered to a grounded package base.

Preferably the application of the wafer to the support (step I) is carried out by means of glue. The removal of GaAs material of steps (II) and (IV) to fully separate one chip from the other and to make accessible the contacts of S, is carried out by selective chemical attack (etching) with e.g. a water solution containing $H_3PO_4$ and $H_2O_2$ (which does not etch the metallization of the source contact).

The remaining photoresist removal of step (V) is carried out by means of an organic solvent, e.g. acetone. Metallization (IV) of the rear face of the single devices is done with electrolithic and preferably electroless gold. Extraction from the support and disconnection (VII) of the single devices are accomplished by organic solvents, in particular trichloroethylene and mounting (VIII) of the metallized rear faces of the single chips on the package base is performed with AuSn soldering alloys or with Ag loaded resins.

The invention comprises also the flat devices thus obtained as well as the packages produced by soldering the rear of several metallized chips to one base.

DESCRIPTION OF THE DRAWINGS

The various aspects and advantages of the invention will become more evident from the description of the preferred, embodiments shown in the attached drawings where:

FIG. 2 is a block diagram of the process according to the invention;
FIG. 3 is a side view of the final FET.

DESCRIPTION OF THE ILLUSTRATED EMBODIMENTS

Figure 2A:
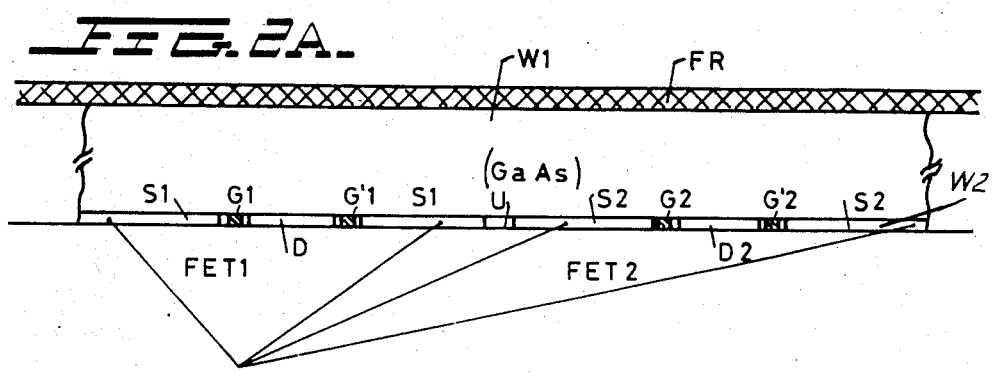
FIGS. 2A, 2B and 2C are front views of the devices during certain steps of said process.
Figure 2B:
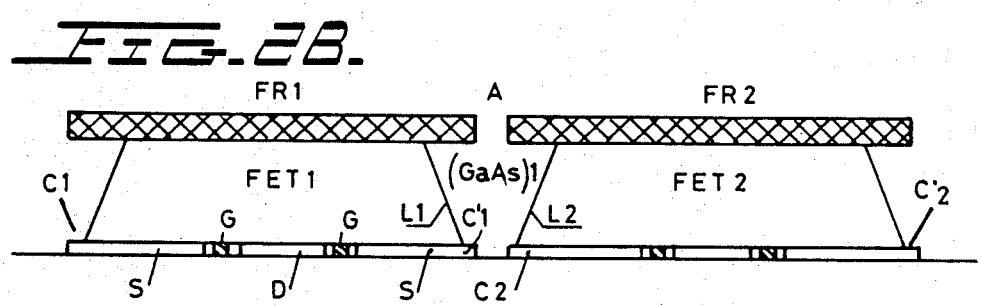
Figure 2C:
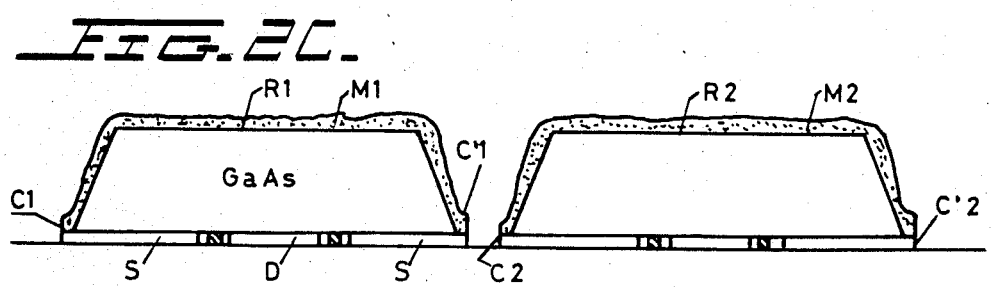

As already mentioned, for the process according to the invention illustrated in FIG. 2, it is necessary to fix (e.g. by means of glue (I) a wafer (W) carrying several devices or FETs, viz $FET_1$, $FET_2$ ....$FET_i$-$FET_n$ on a rigid non conductive support SR. The wafer is of GaAs. A continuous photoresist FR layer (step II of FIG. 2) is applied to face W1 of W not touching support SR.

FIG. 2A shows the product resulting from stages (I) and (II) and consisting of W glued to SR on internal face W2 covered with photoresist FR on rear W1.

For an easier understanding and to simplify the representation FIG. 2A shows a wafer W carrying only two FETs, FET1 and FET2 each one consisting of a source (S1 and S2, respectively), a drain (D1 and D2 respectively) and two gates (G1, G'1 and G2, G'2, respectively).

However, it is evident that the FETs might have a different structure, e.g. each of them might have one gate only. In step (III) a photomask is applied in order to obtain from FR opening A in correspondence with the U-junction section between FET1 and FET2. This operation is carried out in the classical way. Once opening A has been obtained, it is possible to perform a selective etching (IV) on the GaAs below the junction between FET1 and FET2.

This etching is carried out with the aid of a solution containing $H_3PO_4$ and $H_2O_2$ so that said GaAs material between FET1 and FET2 is removed, and moreover source contacts C1-C'1 of FET1 and C2-C'2 of FET2 are made accessible. This because the used acid solution etches (GaAs)1, but it does not etch the metallization of the source contacts.

(GaAs)1 is preferably removed as shown in FIG. 2B, i.e. as a trapezoid with inclined side fronts L1 and L2. U-section too is removed, and in this removal operation the edges C1-C'1, C2-C'2 are left uncovered and accessible thanks to the chemical etching with reversed trapezoid geometry.

In the successive stage (V) the remaining photoresist FR1 and FR2 is removed and a layer of metallization M1 and M2 is applied to the upper surfaces R1 and R2 thus made free.

Figure 1:
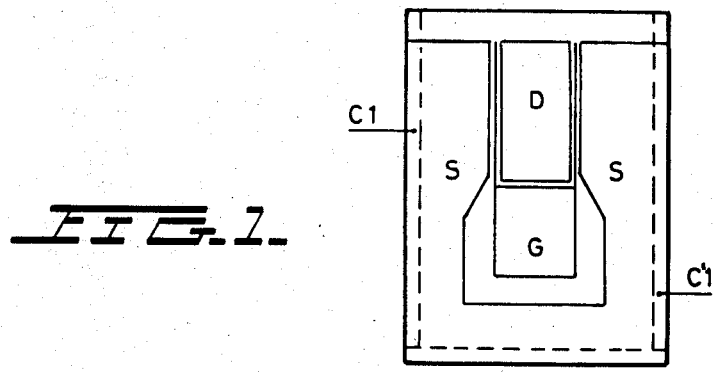
FIG. 1 is a top view of a final FET.

This metal application is critical in that layers M1 and M2 must continuously cover the portions of source contacts C1-C'1 and C2-C'2. In this way, M1 and M2 act as a bridge between said portions or protruding edges of the source contact, as indicated with dashed lines in FIG. 1.

In the successive step (VII) single devices FET1 and FET2 (shown as two in number, rather than as n in number of cases of representation) are disconnected from support SR, whereby use is made of e.g. organic solvents like trichloroethylene. As shown in FIG. 3, said single FETs are fixed on a package base BP by means of their metallization M1 (step VIII).

Preferably the metallized section M1 of FET1 is soldered to zone Q of said golden plated copper base.

Said soldering may be accomplished by means of any traditional process, although a die etch with AuSn alloys or silver loaded resins soldering is preferable.

The number n of FET devices applicable on the package base may be unlimited in that the process according to the invention also includes step VII of disconnection from SR and a separating one device from the other and it permits a good contact for thermal dissipation.

Among the further advantages of the process according to the invention the following is pointed out:
wafer W need not be made excessively thin (diameter equalling 100 microns), hence there is less risk they break during handling;
sophisticated alignment equipment is not required;
the chemical extraction stage is not critical and allows for large tolerances of the source contacts.

Although the invention has been described with reference to the preferred forms shown in the figures, it is not restricted to them. On the contrary, it is subject to any variations, modifications, substitution etc that, in order to be in the technician's reach, may be considered as comprised in the widest scope or spirit of the invention. So for instance it is clear that more steps may be carried out in one single operation and that the block diagram of FIG. 2 may be reduced.

What is claimed is:

1. A process for grounding flat devices and integrated circuits, in particular microwave devices, e.g., power FETs, especially of the GaAs type, that consist of a base of Ga arsenide on which three contacts S (source), LD (drain) and G (gate) are provided, characterized in that:

(I) a GaAs wafer (W) carrying several flat devices (chips) is fixed on a rigid support (SR);
(II) a layer of photoresist (FR) is laid on the free or rear surface of said wafer (W) (i.e., the surface not touching the support);
(III) a photomask is made on the photoresist (FR) in order to obtain openings along borders of single devices present on the face of the wafer (W) touching the support;
(IV) the GaAs material under said openings made in the photoresist is removed until the single devices are completely separated and the source (S) contacts become accessible;
(V) the remaining photoresist still present on the rear of the devices is removed;
(VI) metal is deposited over the entire rear surface and side edges of each device and contacts the source (S) of each device on both edges of each device in all the openings formed by the GaAs removal of step IV;

(VII) the single devices thus metallized on the rear surface are extracted from the support; and (VIII) the so metallized rear face of the single chips disconnected one from the other is soldered to a grounded package base.

2. A process according to claim 1, characterized in that: in step (I) the wafer is fixed on the support by means of glue; in step (IV) the GaAs is removed until the chips are fully separated one from the other, and the S contacts become accessible by means of selective chemical etching with e.g. a water solution containing $H_3PO_4$ and $H_2O_2$ (which does not etch the metallization of the source contact); the remaining photoresist is removed (V by means of organic solvents e.g. acetone; metallization (VI) of the rear face of the single devices is performed with electrolitic or preferably electroless gold; in step (VII) the single devices are extracted from the support by means of organic solvents like trichloroethylene; and the metallized rear face of the single chips is mounted (VIII) on the package base by means of an AuSn soldering alloy or of silver loaded resins.

* * * * *